(12) United States Patent
Wang et al.

(10) Patent No.: US 9,520,338 B2
(45) Date of Patent: Dec. 13, 2016

(54) TRANSISTOR, HEAT SINK STRUCTURE THEREOF AND METHOD FOR MANUFACTURING SAME

(71) Applicant: ZTE CORPORATION, Shenzhen, Guangdong Province (CN)

(72) Inventors: Dapeng Wang, Shenzhen (CN); Zhiyong Zhao, Shenzhen (CN); Wu Zeng, Shenzhen (CN); Xuelu Mu, Shenzhen (CN); Baiqing Zong, Shenzhen (CN); Yijun Cui, Shenzhen (CN)

(73) Assignee: ZTE CORPORATION (CN)

( * ) Notice: Subject to any disclaimer, the term of this patent is extended or adjusted under 35 U.S.C. 154(b) by 0 days.

(21) Appl. No.: 14/653,693

(22) PCT Filed: Aug. 23, 2013

(86) PCT No.: PCT/CN2013/082154
§ 371 (c)(1),
(2) Date: Jun. 18, 2015

(87) PCT Pub. No.: WO2014/094450
PCT Pub. Date: Jun. 26, 2014

(65) Prior Publication Data
US 2015/0348867 A1    Dec. 3, 2015

(30) Foreign Application Priority Data

Dec. 19, 2012    (CN) .......................... 2012 1 0592156

(51) Int. Cl.
*H01L 23/38*    (2006.01)
*H01L 23/367*    (2006.01)
(Continued)

(52) U.S. Cl.
CPC .......... *H01L 23/38* (2013.01); *H01L 21/4871* (2013.01); *H01L 23/34* (2013.01); *H01L 23/3672* (2013.01);
(Continued)

(58) Field of Classification Search
CPC .................. H01L 23/38; H05K 1/0204; H05K 2201/10219
See application file for complete search history.

(56) References Cited

U.S. PATENT DOCUMENTS 6,559,538 B1 * 5/2003 Pomerene ............... H01L 23/38
257/467
6,646,599 B1   11/2003 Apa et al.
(Continued)

FOREIGN PATENT DOCUMENTS

| CN | 2446663 | 9/2001 |
|---|---|---|
| CN | 1309873 | 4/2003 |
| CN | 203118955 | 7/2013 |

OTHER PUBLICATIONS

Communication with Supplementary European Search Report dated Nov. 10, 2015 corresponding to European Patent Application No. EP 13864368.
(Continued)

*Primary Examiner* — Bryan Junge
(74) *Attorney, Agent, or Firm* — McAndrews, Held & Malloy, Ltd.

(57) ABSTRACT

A transistor is provided, which includes: a semiconductor growth substrate and a semiconductor thermoelectric effect device, wherein the semiconductor thermoelectric effect device contains a semiconductor compound layer, a metal layer, a heat conducting layer, a thermocouple heat conducting device and a heat sink layer, the semiconductor compound layer is grown on the semiconductor growth substrate, the metal layer is grown on the semiconductor
(Continued)

A-A compound layer, the heat conducting layer is grown on the metal layer, the thermocouple heating conducting device is grown on the heat conducting layer, and the heat sink layer is grown on the other side surface of the thermocouple heat conducting device opposite to the heat conducting layer. The thermocouple heating conducting device may further contain power supply arms which are grown on the heat conducting layer and are electrically connected with the thermocouple heat conducting device.

16 Claims, 5 Drawing Sheets

(51) Int. Cl.
    *H01L 23/498*     (2006.01)
    *H01L 23/34*     (2006.01)
    *H01L 35/34*     (2006.01)
    *H01L 21/48*     (2006.01)
    *H01L 35/32*     (2006.01)
    *H01L 29/78*     (2006.01)

(52) U.S. Cl.
    CPC ..... *H01L 23/3675* (2013.01); *H01L 23/49844* (2013.01); *H01L 35/32* (2013.01); *H01L 35/34* (2013.01); *H01L 29/78* (2013.01); *H01L 2924/0002* (2013.01)

(56) References Cited

U.S. PATENT DOCUMENTS

| | | | | |
|---|---|---|---|---|
| 6,800,933 | B1* | 10/2004 | Mathews | H01L 23/38 257/467 |
| 6,880,345 | B1* | 4/2005 | Leija | H01L 23/34 257/E23.08 |
| 2003/0183267 | A1 | 10/2003 | McIntyre et al. | |
| 2008/0157141 | A1* | 7/2008 | Han | H01L 27/14645 257/292 |
| 2008/0229759 | A1* | 9/2008 | Ouyang | H01L 23/38 62/3.3 |
| 2012/0139076 | A1 | 6/2012 | Shankar et al. | |

OTHER PUBLICATIONS

Peranio N et al. "Structural and thermoelectric properties of epitaxially grown Bi2Te3 thin films and superlattices", Journal of Applied Physics, American Institute of Physics, US, vol. 100, No. 11, Dec. 6, 2006, pp. 114306-114306, XP012089191, ISSN: 0021-8979, DOI: 10.1063/1.2375016.

* cited by examiner

TRANSISTOR, HEAT SINK STRUCTURE THEREOF AND METHOD FOR MANUFACTURING SAME

CROSS-REFERENCE TO RELATED APPLICATIONS/INCORPORATION BY REFERENCE

This application is a 371 of International Patent Application No. PCT/CN2013/082154, filed Aug. 23, 2013, entitled "TRANSISTOR, HEAT DISSIPATION STRUCTURE OF TRANSISTOR, AND PRODUCTION METHOD FOR TRANSISTOR", which claims priority to Chinese Patent Application No. 201210592156.4, filed Dec. 19, 2012, entitled "TRANSISTOR, TRANSISTOR HEAT RADIATION STRUCTURE AND TRANSISTOR PRODUCTION METHOD". The above-identified applications are hereby incorporated herein by reference in their entirety.

FIELD OF THE INVENTION

The present disclosure relates to the technical field of electronics, in particular to a transistor, a heat sink structure of the transistor and a method for manufacturing the transistor.

BACKGROUND OF THE INVENTION

A power amplifier is essential to a wireless communication system, a medical system, a power device, an audio system, a military radar system and other devices, and its main function is to amplify the power of a transmitted signal. These devices set a relatively high requirement on the power. For example, the power of the wireless communication system is tens or hundreds of watts, the power of the medical system can reach thousands of watts, and the power of the radar device may be as high as several thousands of watts. To reach such high transmission power, a large-power power amplifier is required to amplify it, and the transistor, as a core device of the power amplifier, is responsible for the amplification and the output of all power. However, due to the limitation of the working power of the amplifier, not all the amplified power is output as a useful signal. For example, in an ordinary communication system, only 40% of the power is output as the useful signal of the power amplifier and 60% of the power exists in a form of heat. A small part of the heat may be transferred to the air around so as to avoid causing a big impact on the system; while a large part of the heat is concentrated in the tube core of the power amplifier and the devices around it, such as a ceramic capacitor and an aluminium electrolytic capacitor, which may approach or exceed an acceptable critical temperature easily, and too much heat may affect the performance index and the service life of these devices and cause a significant damage to the reliability of the system.

Figure 1:
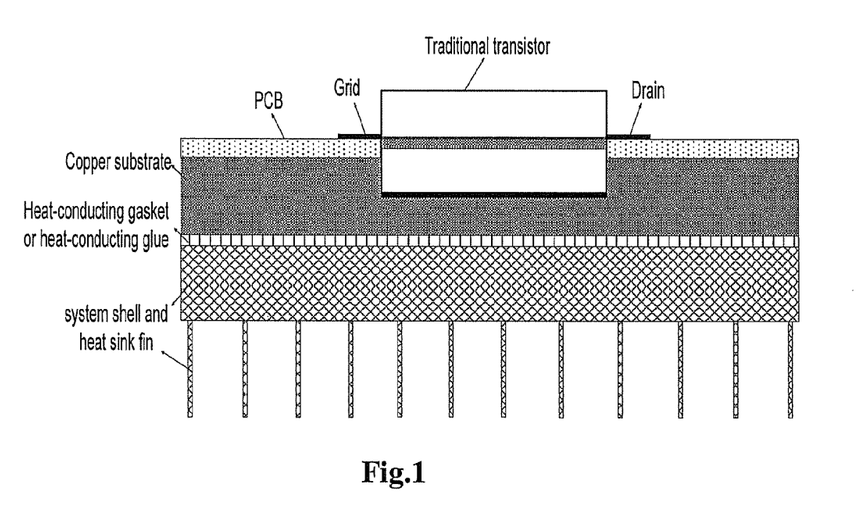
FIG. 1 is diagram of a heat sink device of a traditional transistor.

At present, the heat dissipation way of a large-power transistor in a traditional communication device is as follows: as shown in FIG. 1, which is a diagram of a traditional transistor heat dissipation device in a power amplifier, a transistor is welded on a Printed Circuit Board (PCB) which is fixed on a copper substrate; a source metal at the bottom of the transistor is welded on the copper substrate, and then the copper substrate is fixed on the shell of the device. Usually, heat-conducting glue may be coated or a heat-conducting gasket or other contactants may be added between the copper substrate and the shell of the device. Heat is transferred from the tube core to the copper substrate through the source metal and then to the shell of the device or a heat dissipation fin through the heat-conducting glue and finally forms heat exchange with the environment around.

The heat resistance between the power transistor and the shell of the device may be affected in various aspects. For example, the welding effect of a tube, the heat resistance of a power amplifier copper substrate, the uniformity of the heat-conducting glue and the like may increase the heat resistance, so that the heat transferring efficiency is low, heat cannot be conducted out in time, and the tube core of the transistor has a very high temperature after achieving heat balance. Moreover, the heat may be conducted to other devices on the PCB quickly to heat them, thereby affecting their performances and service lives. Furthermore, many heat dissipation fins are arranged on the shell of the device so as to increase the volume of the whole device and reduce the competitive advantage.

Peltier effect is called a second semiconductor thermoelectric effect, and a thermocouple refrigeration device manufactured based on this effect has been applied to many fields of this industry and has many advantages. For example, the thermocouple refrigeration device is fast in refrigeration and heating, compact in structure, light in weight, noiseless and reliable, achieves a temperature control tolerance within ±0.1° C., and can achieve a temperature difference of more than 100° C. after being cascaded in multistage etc. However, all the refrigeration devices are externally used as accessories at present so that additional purchase and installation are required. Especially, the refrigeration devices are not applied to the heat dissipation of the large-power power amplifier.

SUMMARY OF THE INVENTION

The embodiments of the present disclosure provide a transistor, a heat dissipation device of the transistor and a method for manufacturing the transistor, so as to solve the heat dissipation problem of the transistor in the prior art.

The technical solutions provided by the embodiments of the present disclosure areas follows:

A transistor includes: a semiconductor growth substrate and a semiconductor thermoelectric effect device, wherein the semiconductor thermoelectric effect device contains a semiconductor compound layer, a metal layer, a heat conducting layer, a thermocouple heat conducting device and a heat sink layer, the semiconductor compound layer is grown on the semiconductor growth substrate, the metal layer is grown on the semiconductor compound layer, the heat conducting layer is grown on the metal layer, the thermocouple heating conducting device is grown on the heat conducting layer, and the heat sink layer is grown on the other side surface of the thermocouple heat conducting device opposite to the heat conducting layer. The thermocouple heating conducting device may further contain power supply arms which are grown on the heat conducting layer and are electrically connected with the thermocouple heat conducting device.

Preferably, the thermocouple heat conducting device contains groups of N type thermocouples and P type thermocouples, multiple channels arranged in sequence are set on the metal layer, the openings of the channels are located on the opposite side of the bonding surface of the metal layer and the semiconductor compound layer, the heat conducting layer is grown at the bottom of each channel, multiple groups of N type thermocouples and P type thermocouples are grown on the heat conducting layer along the channels, the N type thermocouples and the P type thermocouples in each group are electrically connected with each other, the N type thermocouple and the P type thermocouple in adjacent groups are electrically connected with each other to form a path of N type thermocouple to P type thermocouple to N type thermocouple, and the power supply arms are electrically connected with the N type thermocouple at one end of each channel and the P type thermocouple at the other end of that channel.

Preferably, the thermocouple heat conducting device may further include first power supply electrodes and second power supply electrodes, wherein the first power supply electrodes are grown at the tops of the N type thermocouple and the P type thermocouple in the adjacent groups on the heat conducting layer in the channels and in the position between them and are electrically connected with the N type thermocouple and the P type thermocouple in the adjacent groups; and the second power supply electrodes are grown at the bottoms of the N type thermocouple and the P type thermocouple in each group and in the position between them and are electrically connected with the N type thermocouple and the P type thermocouple in each group.

Preferably, the thermocouple heat conducting device may further include a temperature detection point which is grown on the heat conducting layer on the metal layer.

A heat sink structure of a transistor includes: a printed circuit board, a heat fin substrate and a transistor, wherein the printed circuit board is bonded on the heat fin substrate, the transistor is connected with the printed circuit board and includes a semiconductor growth substrate and a semiconductor thermoelectric effect device, the semiconductor thermoelectric effect device contains a semiconductor compound layer, a metal layer, a heat conducting layer, a thermocouple heat conducting device and a heat sink layer, the semiconductor compound layer is grown on the semiconductor growth substrate, the metal layer is grown on the semiconductor compound layer, the heat conducting layer is grown on the metal layer, the thermocouple heating conducting device is grown on the heat conducting layer, and the heat sink layer is grown on the other side of the thermocouple heat conducting device opposite to the heat conducting layer, the metal layer of the transistor is welded with the heat fin on the heat fin substrate, the heat sink layer is contacted with the heat fin, and the thermocouple heating conducting device may further contain power supply arms which are grown on the heat conducting layer and are electrically connected with the thermocouple heat conducting device.

Preferably, the thermocouple heat conducting device contains groups of N type thermocouples and P type thermocouples, multiple channels arranged in sequence are set on the metal layer, the openings of the channels are located on the opposite side of the bonding surface of the metal layer and the semiconductor compound layer, the heat conducting layer is grown at the bottom of each channel, multiple groups of N type thermocouples and P type thermocouples are grown on the heat conducting layer along the channels, the N type thermocouples and the P type thermocouples in each group are electrically connected with each other, the N type thermocouple and the P type thermocouple in adjacent groups are electrically connected with each other to form a path of N type thermocouple to P type thermocouple to N type thermocouple, and the power supply arms are electrically connected with the N type thermocouple at one end of each channel and the P type thermocouple at the other end of that channel.

Preferably, the thermocouple device may further include first power supply electrodes and second power supply electrodes, wherein the first power supply electrodes are grown at the tops of the N type thermocouple and the P type thermocouple in the adjacent groups on the heat conducting layer in the channels and in the position between them and are electrically connected with the N type thermocouple and the P type thermocouple in the adjacent groups; and the second power supply electrodes are grown at the bottoms of the N type thermocouple and the P type thermocouple in each group and in the position between them and are electrically connected with the N type thermocouple and the P type thermocouple in each group.

Preferably, the heat sink structure may further include a direct current power supply device and a temperature detection and control chip, the thermocouple heat conducting device may further include a temperature detection point which is grown on the heating conducting layer on the metal layer, and the temperature detection and control chip is connected with the temperature detection point and the direct current power supply device respectively.

A method for manufacturing a transistor, includes the following steps:

a. a growth substrate layer is provided, and the parts such as a conductive channel, a doped region, a semiconductor oxide and power supply electrodes above the substrate are grown, b. a semiconductor compound layer is grown on the semiconductor growth substrate layer, c. a metal film is epitaxially grown on the surface of the compound layer, a metal layer is formed on the interface where a metal and a semiconductor are bonded through the vapor deposition technique, multiple regularly arranged channels are etched on the metal layer, and the openings of the channels are located on the opposite side of the bonding surface of the metal layer and the semiconductor compound layer, d. a heat conducting layer is grown at the bottom of each channel through the vapor deposition technique, e. power supply arms and first power supply electrodes are epitaxially grown on the surface of the heat conducting layer through the electroplating and vapor deposition technique and are separated from each other, f. an N/P thermocouple semiconductor layer is epitaxially grown on the surfaces of the first power supply electrodes, and the semiconductor material is doped through a high temperature diffusion method and an ion implantation method to grow alternately arranged N type and P type thermocouples, g. second power supply electrodes are epitaxially grown on the ends of the N/P type thermocouples of the thermocouple semiconductor layer opposite to the first power supply electrodes through the vapour deposition technique or an electroplating method, and h. a heat conducting layer is covered on the surfaces of the second power supply electrodes.

Preferably, the power supply arms and the first power supply electrodes are machined as separate parts with the same height.

Preferably, the heat conducting layer and the heat sink layer are made of the same heat conducting material, and the outermost surface of the heat sink layer and the outermost surfaces of the channels are aligned.

Preferably, a conductive metal film layer as the temperature detection point is epitaxially grown on the heat conducting layer through the electroplating or vapor deposition technique.

To sum up, according to the embodiments of the present disclosure, the heat of the transistor can be conducted and emitted fast, so that the reliability of power amplifier tubes and the components nearby is increased, the performance index of power amplifiers at a high temperature is greatly improved, moreover, the service life of devices is prolonged and the competitiveness is improved.

DETAILED DESCRIPTION OF THE EMBODIMENTS

Based on the traditional Lateral Diffusion Metal Oxide Semiconductor Field Effect Transistor (LDMOSFET) structure, the present disclosure proposes a new fast heat conductive transistor structure by applying the Peltier effect of semiconductor to the traditional field effect transistor structure in combination with the current semiconductor processing technology (for example, epitaxial growth and vapor deposition) to solve the heat conducting problem of traditional transistors. In addition to keeping the bonding methods for current tubes for the purpose of convenient use, the transistor of the present disclosure conducts heat from a tube core to a heat fin fast and controls the temperature in a certain range. Different from the usage of traditional semiconductor thermocouple refrigeration devices, the present disclosure combines a semiconductor thermocouple and a heat sink device with a field effect transistor by the epitaxial growth process for a semiconductor, thereby forming an integrated growth structure and reducing unnecessary influence from heat resistance. From the point of view of appearance, the encapsulation structure is complete and the bonding method is the same as that of the traditional transistors, so that the effect of heat conduction is better and the temperature is detectable and controllable.

Figure 2:
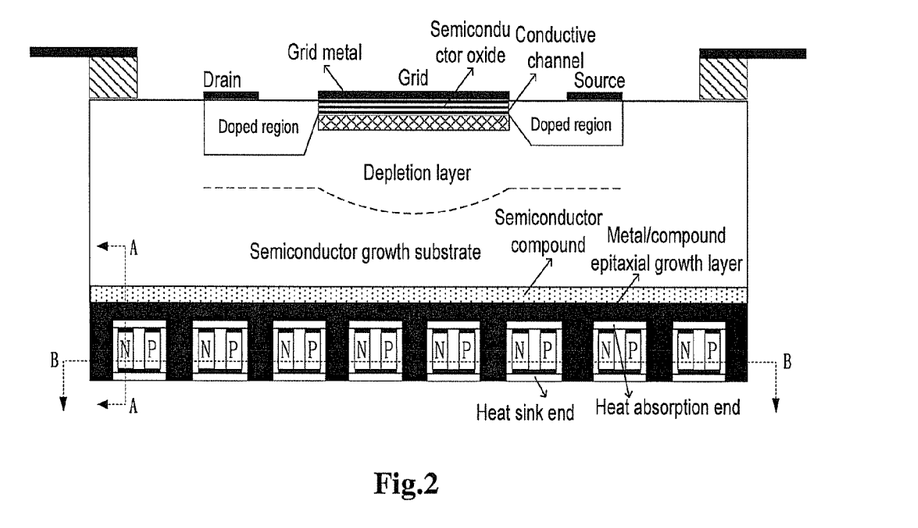
FIG. 2 is a diagram of a novel transistor based on the Peltier effect according to an embodiment of the present disclosure.

As shown in FIG. 2, a conductive channel, a doped region, a semiconductor oxide, a metal electrode and others necessary for the operation of transistor are grown on the semiconductor growth substrate through a traditional transistor processing technology. The lower half part of FIG. 2 is a diagram of a semiconductor thermoelectric effect device and a semiconductor substrate which are bonded.

Figure 4:
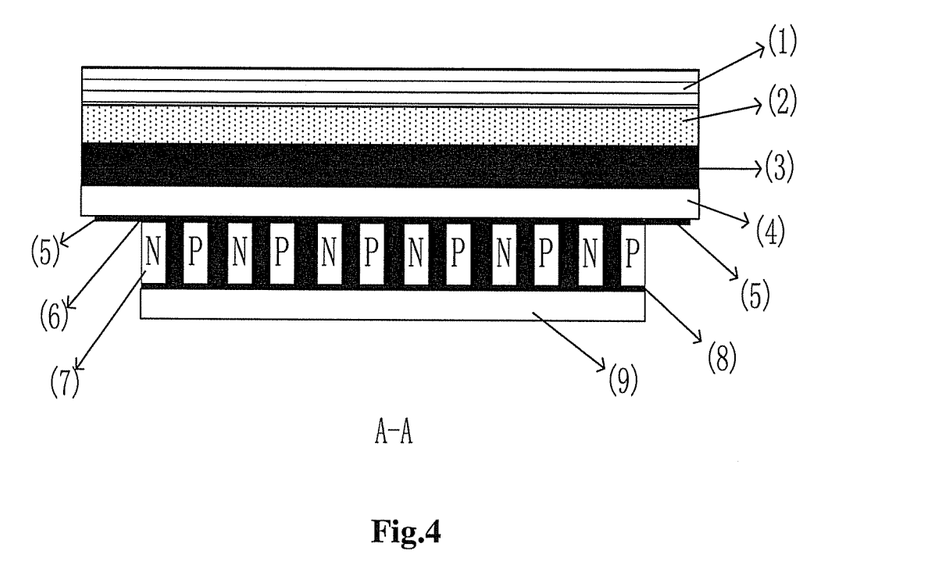
FIG. 4 is an A-A sectional view of a side surface of a transistor according to an embodiment of the present disclosure.

As shown in the A-A sectional view of FIG. 4, layer (1) is a semiconductor growth substrate. Layer (2) is a semiconductor compound grown on the semiconductor growth substrate. According to the formation mechanism of metal/semiconductor, a metal growth layer film is formed on the semiconductor compound layer (2), such as transition magnetic metals: Mn and Cu, and a thick metal layer (3) is formed on the metal film and is used as the source grounding metal and the heat transfer metal layer (3) for the transistor. A heat conducting layer (4) and a heat sink layer (9) play the functions of heat transfer and insulation, high thermal conductivity and thermal stability are required, such as aluminium nitride and beryllium oxide; the layer (4) is used as the heat absorption end to absorber heat from the bottom of transistor and plays the functions of insulating a source metal layer and power supply electrodes of thermocouples; and the heat sink end of the layer (9) transfers the heat conducted by the thermocouples to an external heat sink. Layer (5) is positive and negative power supply arms of thermocouples and is connected with the positive and the negative poles of a power supply by welding. First power supply electrodes (6) and Second power supply electrodes (8) are power supply electrodes of N/P type thermocouples to serially connect the N/P type thermocouples end to end, thereby flowing current. Layers (5), (6) and (8) are separate parts, layers (5) and (6) have the same height, and layer (5) is two arms required for supplying power to the direct current power supply; layers (6) and (8) are located at two ends of N/P thermocouple poles and composed of separate metal electrodes respectively, the metal electrodes are connected with two electrodes of adjacent N and P type thermocouple poles, and layers (6) and (8) are connected with each other through an N or a P type thermocouple pole; so that layers (5), (6) and (8) constitute a current path.

Layer (7) is a N/P type thermocouple layer and is formed by a semiconductor doping process, the current in the loop flows from N to P to N in sequence to transfer heat from the heat receiving end to the heat sink end, and the amount of received heat is related to the current magnitude and the number of thermocouples. Point (10) in FIG. 5 is a temperature detection point, which is connected with a temperature detection chip and is used for detecting the temperature at the bottom of the transistor and controlling the current at two ends of the N/P type thermocouple layer.

Figure 5:
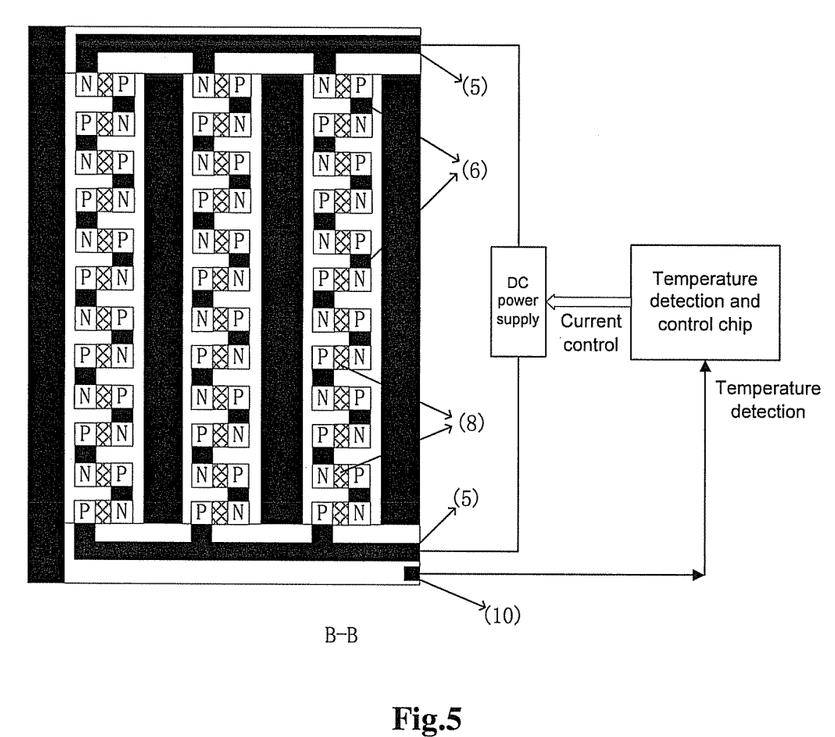
FIG. 5 is a B-B sectional view of the bottom of a transistor according to an embodiment of the present disclosure.

As shown in the B-B sectional view of the bottom of a transistor in FIG. 5, the source metal and the N/P thermocouples are alternately arranged to meet the grounding requirements of the source metal as well as the power supply and heat sink requirements of thermocouples.

The temperature difference between the heat receiving end of layer (4) and the heat sink end of layer (9) may reach 71° C. in case of one single layer of N/P thermocouple in FIG. 2 is used and reach 131° C. in case of multiple layers are used, and the maximum power dissipation may reach 300 W.

The heat sink device of the present disclosure is suitable, for the transistor the conductive channels of which are parallel to the grounding surface to dissipate heat at the maximum efficiency; and the present disclosure does not limit the type of the semiconductor growth substrate and is adapted to the field effect transistors such as Si substrate MOSFET, GaAsMESFET and GaNFET and semiconductor substrate transistors such as silicon germanide and indium phosphide, all of which have the characteristics that the source metal is parallel to the conductive channel and is tightly bonded to the grounding surface and the heat sink surface.

Figure 6:
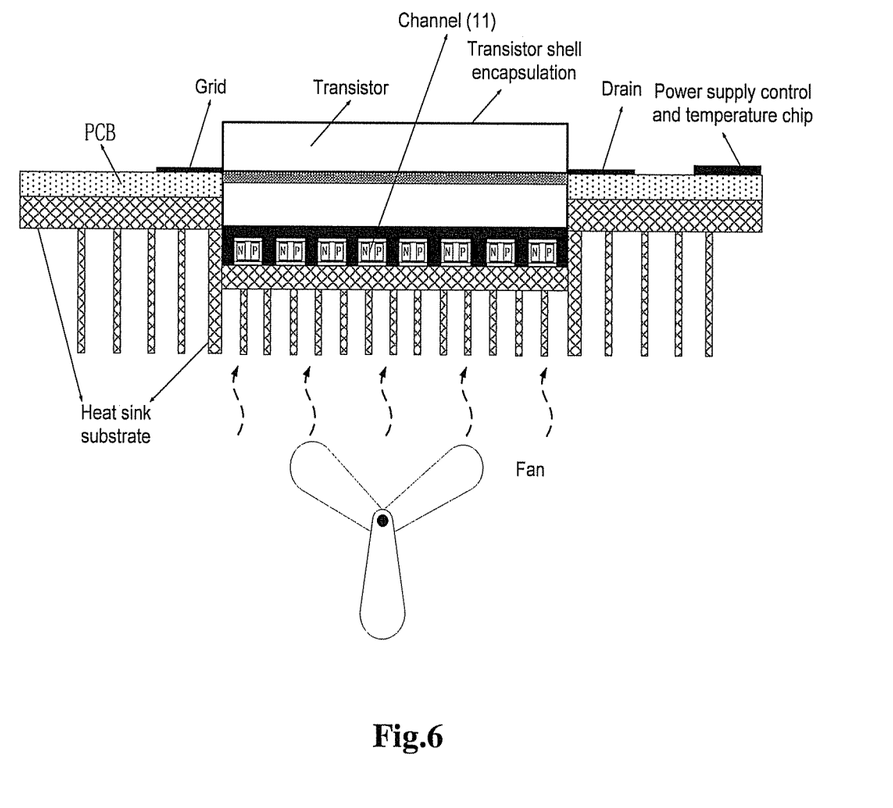
FIG. 6 is a diagram of an example of heat sink application of a transistor according to an embodiment of the present disclosure.

FIG. 6 is an example of heat sink application of a transistor. A PCB is bonded on the heat fin substrate which is a part of the whole casing, the grid and the drain of the transistor are welded on the PCB, and the source metal at the bottom is well welded with the heat fin below. In FIG. 4, the heat sink end of layer (9) and the heat fin are well contacted with each other, and the positive and negative power supply electrodes of layer (5) are connected with the power supply on the PCB through wires. In FIG. 5, wires can be welded at the temperature detection point (10) and pass through the heat fin to communicate with the temperature detection chip on the PCB, or can be extracted from the inside of the tube to form terminals and communicate with the cables.

The vast majority of heat from the transistor is conducted to the heat fin through the N/P thermocouples and is then blown to the ambient air by external fans (fans can be assembled on the whole casing), or reaches the same effect by water cooling and other methods, so that the vast majority of heat is emitted and the remaining heat is transferred to the PCB through the heat fin, this remaining heat has little influence on the device. The temperature detection chip detects the temperature of the heat receiving end of layer (4) in FIG. 4 in real time and automatically controls the current according to the relationship between temperature and current (acquired by the experimental data acquisition before use) so as to control the heat conduction efficiency of the N/P thermocouples, thereby controlling the temperature of the transistor in the prescribed range.

To reach a better heat conduction effect, the bottom area of the transistor can be enlarged to increase the number of N/P thermocouple poles, thereby emitting heat more efficiently. It is suggested that the height of the N/P thermocouple pole should be between 2.5 mm and 4 mm. If the height is insufficient, the heat conduction effect may be influenced due to small amount of doped charge in the thermocouple material; and if the height is too large, the length of the heat fin of source metal may be increased accordingly, influencing the grounding effect of the source, especially for the transistors that are working at a high frequency. In addition, other methods can be used for increasing the heat conduction effect. For example, as for the large power transistors working at a low frequency, multiple layers of N/P thermocouple poles can be overlapped to enhance the heat conduction performance. However, such multilayer method is not recommended to a high-frequency transistors (unless there is no influence on the grounding effect of the source); or other shapes such as folding form and curving form are made for the growth on the upper casing of the transistor to increase the heat conduction channel and area. The specific ways should be expanded and limited according to the system device and the heat sink condition.

Figure 3:
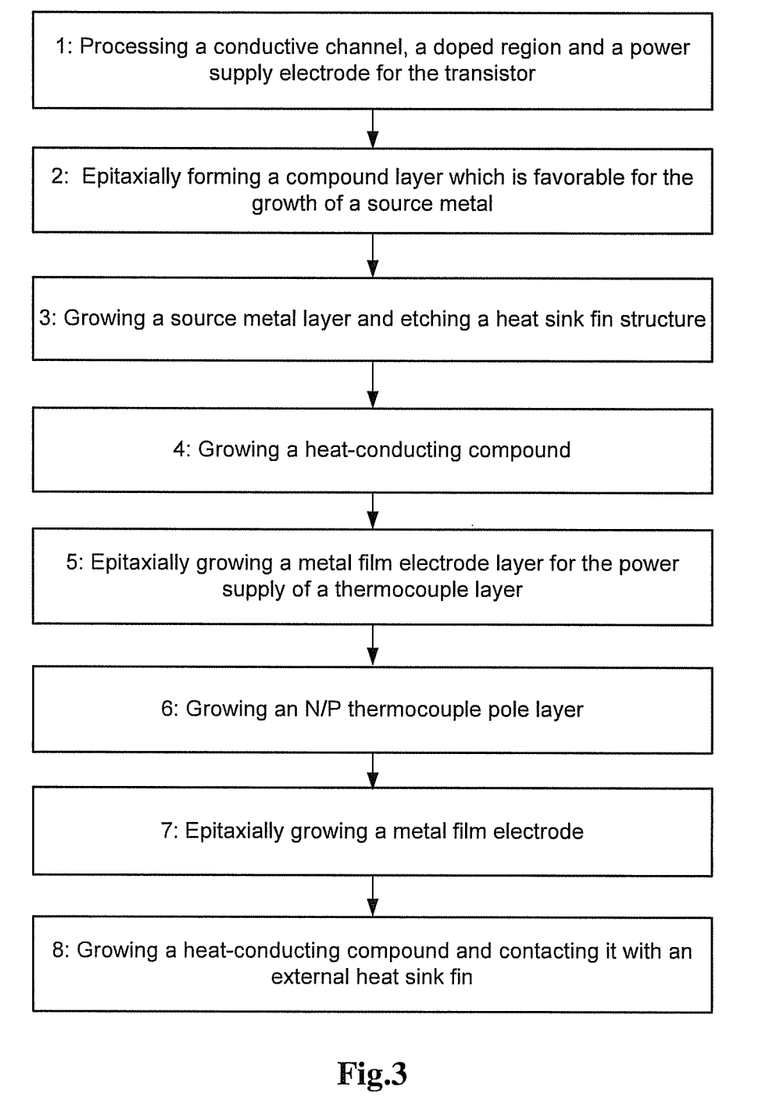
FIG. 3 is a flowchart of a process of manufacturing a novel transistor semiconductor according to an embodiment of the present disclosure.

FIG. 3 is a flowchart of manufacturing a novel transistor semiconductor of the present disclosure, and the detailed and exploded description for the manufacturing implementation way is made below in combination with FIGS. 3, 4 and 5. It should be noted here that the following semiconductor processing process and technology shown and described are one way to realize the new transistor structure, other different or new processes for processing semiconductor are allowed to implement such structure, and more detailed technical details and steps before or after respective steps are allowed.

Step 1: A transistor magnifying function area is processed (see frame 1 in FIG. 3 and the structural diagram in FIG. 4), wherein a growth substrate layer (1) such as monocrystalline silicon, silicon carbide and gallium arsenide is provided first, and the parts above the substrate such as a conductive channel, a doped region, a semiconductor oxide and power supply electrodes are grown.

Step 2: The processing for the transistor heat conduction function area is started in this step (see frame 2 in FIG. 3, and FIG. 4), wherein a semiconductor compound layer (2) is preferably grown on the semiconductor growth substrate and is required to have high heat conduction efficiency and good thermal stability and facilitate the growth of the epitaxial layer of the following metal film such as IV-VI compounds.

Step 3: See frame 3 in FIG. 3, and FIG. 4, a layer of metal film is epitaxially grown on the compound surface layer (2) to form a metal/IV-VI semiconductor interface, and the metal material can be the same as the grid and the source or not but must be a good power and heat conductive material. A high-purity thick metal layer (3) is formed on the metal/semiconductor interface through the vapor deposition technique to sever as a source grounding metal layer and a heat transfer layer; and then multiple regularly arranged channels (11) are etched on the source metal layer for the growth of N/P thermocouples.

Step 4: See frame 4 in FIG. 3, and FIG. 4, a heat conducting layer (4) such as beryllium oxide and aluminium nitride with a good heat conduction effect is grown on the surfaces of the channels of the source metal through the vapor deposition technique again on the basis of Step 3, and the vapor deposition technique can effectively control the density and the purity of the compound.

Step 5: See frame 5 in FIG. 3, and FIGS. 4 and 5, a conductive metal film is epitaxially grown on the surface of the heat conductive compound in the channels mentioned in Step 4 through the electroplating or vapor deposition technique to serve as layers (5), (6) and (10), and in the growth process, the parts without metal are covered by die, so that the metal layer is only formed at the required parts, and layer (10) is a temperature detection point.

Step 6: See frame 6 in FIG. 3, and FIG. 4, a thermocouple semiconductor material layer (7), bismuth telluride usually, is epitaxially grown on the basis of layer (6), and is then doped by the high temperature diffusion and ion implantation method to grow alternately arranged N type and P type thermocouples.

Step 7: See frame 7 in FIG. 3, and FIG. 4, a metal film is epitaxially grown at the tops of the N/P type thermocouple layer (7) through the vapour deposition or electroplating method to serve as the second power supply electrode layer (8), and the metal electrodes serially connect the N/P type thermocouples end to end, and the heat is transmitted from the heat receiving end to the heat sink end in parallel.

Step 8: See frame 8 in FIG. 3, and FIG. 4, a heat conductive material which is the same as that of layer (4) is covered on the surfaces of the metal electrodes of layer (8) to serve as a heat sink layer (9), and the outermost surface of this layer is aligned to the outermost surfaces of the channels to guarantee good contact between the source metal and the heat conductive material of layer (9) with the bottom heat sink, preventing the heat sink effect from being affected.

What is claimed is:

1. A transistor, comprising: a semiconductor growth substrate and a semiconductor thermoelectric effect device, wherein the semiconductor thermoelectric effect device comprises a semiconductor compound layer (2), a metal layer (3), a heat conducting layer (4), a thermocouple heat conducting device and a heat sink layer (9), the semiconductor compound layer (2) is grown on the semiconductor growth substrate, the metal layer (3) is grown on the semiconductor compound layer (2), the heat conducting layer (4) is grown on the metal layer (3), the thermocouple heat conducting device is grown on the heat conducting layer (4), and the heat sink layer (9) is grown on the other side surface of the thermocouple heat conducting device opposite to the heat conducting layer (4); and the thermocouple heat conducting device may further contain power supply arms (5) which are grown on the heat conducting layer (4) and are electrically connected with the thermocouple heat conducting device;

wherein the thermocouple heat conducting device comprises groups of N type thermocouples and P type thermocouples, multiple channels (11) arranged in sequence are set on the metal layer (3), the openings of the channels are located on the opposite side of the bonding surface of the metal layer (3) and the semiconductor compound layer (2), the heat conducting layer (4) is grown at the bottom of each channel, multiple groups of N type thermocouples and P type thermocouples are grown on the heat conducting layer (4) along the channels (11), the N type thermocouples and the P type thermocouples in each group are electrically connected with each other, the N type thermocouple and the P type thermocouple in adjacent groups are electrically connected with each other to form a path of N type thermocouple to P type thermocouple to N type thermocouple, and the power supply arms (5) are electrically connected with the N type thermocouple at one end of each channel (11) and the P type thermocouple at the other end of that channel.

2. The transistor according to claim 1, wherein the thermocouple heat conducting device may further comprise first power supply electrodes (6) and second power supply electrodes (8), the first power supply electrodes (6) are grown at the tops of the N type thermocouple and the P type thermocouple in the adjacent groups on the heat conducting layer (4) in the channels (11) and in the position between them and are electrically connected with the N type thermocouple and the P type thermocouple in the adjacent groups; and the second power supply electrodes (8) are grown at the bottoms of the N type thermocouple and the P type thermocouple in each group and in the position between them and are electrically connected with the N type thermocouple and the P type thermocouple in each group.

3. The transistor according to claim 2, wherein the thermocouple heat conducting device further comprise a temperature detection point (10) which is grown on the heat conducting layer (4) on the metal layer (3).

4. The transistor according to claim 1, wherein the thermocouple heat conducting device further comprise a temperature detection point (10) which is grown on the heat conducting layer (4) on the metal layer (3).

5. A heat sink structure of a transistor, comprising: a printed circuit board, a heat fin substrate and a transistor, wherein the printed circuit board is bonded on the heat fin substrate, the transistor is connected with the printed circuit board and comprises a semiconductor growth substrate and a semiconductor thermoelectric effect device, the semiconductor thermoelectric effect device comprises a semiconductor compound layer (2), a metal layer (3), a heat conducting layer (4), a thermocouple heat conducting device and a heat sink layer (9), the semiconductor compound layer (2) is grown on the semiconductor growth substrate, the metal layer (3) is grown on the semiconductor compound layer (2), the heat conducting layer (4) is grown on the metal layer (3), the thermocouple heat conducting device is grown on the heat conducting layer (4), and the heat sink layer (9) is grown on the other side of the thermocouple heat conducting device opposite to the heat conducting layer (4), the metal layer (3) of the transistor is welded with the heat fin on the heat fin substrate, the heat sink layer (9) is contacted with the heat fin, and the thermocouple heat conducting device may further contain power supply arms (5) which are grown on the heat conducting layer (4) and are electrically connected with the thermocouple heat conducting device.

6. The heat sink structure of a transistor according to claim 5, wherein the thermocouple heat conducting device comprises groups of N type thermocouples and P type thermocouples, multiple channels (11) arranged in sequence are set on the metal layer (3), the openings of the channels (11) are located on the opposite side of the bonding surface of the metal layer (3) and the semiconductor compound layer (2), the heat conducting layer (4) is grown at the bottom of each channel (11), multiple groups of N type thermocouples and P type thermocouples are grown on the heat conducting layer (4) along the channels, the N type thermocouples and the P type thermocouples in each group are electrically connected with each other, the N type thermocouple and the P type thermocouple in adjacent groups are electrically connected with each other to form a path of N type thermocouple to P type thermocouple to N type thermocouple, and the power supply arms (5) are electrically connected with the N type thermocouple at one end of each channel (11) and the P type thermocouple at the other end of that channel (11).

7. The heat sink structure of a transistor according to claim 6, wherein the thermocouple device further comprise first power supply electrodes (6) and second power supply electrodes (8), wherein the first power supply electrodes (6) are grown at the tops of the N type thermocouple and the P type thermocouple in the adjacent groups on the heat conducting layer (4) in the channels (11) and in the position between them and are electrically connected with the N type thermocouple and the P type thermocouple in the adjacent groups; and the second power supply electrodes (8) are grown at the bottoms of the N type thermocouple and the P type thermocouple in each group and in the position between them and are electrically connected with the N type thermocouple and the P type thermocouple in each group.

8. The heat sink structure of a transistor according to claim 7, further comprising a direct current power supply device and a temperature detection and control chip, wherein the thermocouple heat conducting device may further comprise a temperature detection point (10) which is grown on the heating conducting layer (4) on the metal layer (3), and the temperature detection and control chip is connected with the temperature detection point (10) and the direct current power supply device respectively.

9. The heat sink structure of a transistor according to claim 6, further comprising a direct current power supply device and a temperature detection and control chip, wherein the thermocouple heat conducting device may further comprise a temperature detection point (10) which is grown on the heating conducting layer (4) on the metal layer (3), and the temperature detection and control chip is connected with the temperature detection point (10) and the direct current power supply device respectively.

10. The heat sink structure of a transistor according to claim 5, further comprising a direct current power supply device and a temperature detection and control chip, wherein the thermocouple heat conducting device may further comprise a temperature detection point (10) which is grown on the heating conducting layer (4) on the metal layer (3), and the temperature detection and control chip is connected with the temperature detection point (10) and the direct current power supply device respectively.

11. A method for manufacturing a transistor, comprising the following steps:

providing a growth substrate layer (1), and growing the parts above the substrate layer (1), wherein the parts above the substrate layer comprises a conductive channel (11), a doped region, a semiconductor oxide and power supply electrodes;

growing a semiconductor compound layer (2) on the semiconductor growth substrate layer (1);

epitaxially growing a metal film on the surface of the compound layer (2), forming a metal layer (3) on the interface where a metal and a semiconductor are bonded through the vapor deposition technique, etching multiple regularly arranged channels (11) on the metal layer (3), and locating the openings of the channels (11) on the opposite side of the bonding surface of the metal layer (3) and the semiconductor compound layer (2);

growing a heat conducting layer (4) at the bottom of each channel (11) through the vapor deposition technique;

epitaxially growing power supply arms (5) and first power supply electrodes (6) on the surface of the heat conducting layer (4) through the electroplating and vapor deposition technique, the power supply arms (5) and the first power supply electrodes (6) being separated from each other;

epitaxially growing an N/P thermocouple semiconductor layer (7) on the surfaces of the first power supply electrodes (6), and doping the semiconductor material through a high temperature diffusion method and an ion implantation method to grow alternately arranged N type and P type thermocouples;

epitaxially growing second power supply electrodes (8) on the ends of the N/P type thermocouples of the thermocouple semiconductor layer (7) opposite to the first power supply electrodes (6) through the vapour deposition technique or an electroplating method, and covering a heat conducting layer (9) on the surfaces of the second power supply electrodes (8).

12. The method for manufacturing a transistor according to claim 11, the method further comprises:

machining the power supply arms (5) and the first power supply electrodes (6) as separate parts with the same height.

13. The method for manufacturing a transistor according to claim 12, wherein the heat conducting layer (4) and the heat sink layer (9) are made of the same heat conducting material, and the outermost surface of the heat sink layer (9) and the outermost surfaces of the channels (11) are aligned to each other.

14. The method for manufacturing a transistor according to claim 13, the method further comprises:

epitaxially growing a conductive metal film layer as the temperature detection point (10) on the heat conducting layer (4) through the electroplating or vapor deposition technique.

15. The method for manufacturing a transistor according to claim 12, the method further comprises:

epitaxially growing a conductive metal film layer as the temperature detection point (10) on the heat conducting layer (4) through the electroplating or vapor deposition technique.

16. The method for manufacturing a transistor according to claim 11, the method further comprises:

epitaxially growing a conductive metal film layer as the temperature detection point (10) on the heat conducting layer (4) through the electroplating or vapor deposition technique.

* * * * *